United States Patent [19]
Johnstone et al.

[11] Patent Number: 5,258,939
[45] Date of Patent: Nov. 2, 1993

[54] FOLD AND DECIMATE FILTER ARCHITECTURE

[75] Inventors: William F. Johnstone; David H. Damerow, both of Palm Bay, Fla.

[73] Assignee: Harris Corporation, Melbourne, Fla.

[21] Appl. No.: 774,628

[22] Filed: Oct. 10, 1991

[51] Int. Cl.$^5$ ............................................... G06F 15/31
[52] U.S. Cl. ................................................. 364/724.1
[58] Field of Search ............. 364/724.01, 724.1, 724.16

[56] References Cited

U.S. PATENT DOCUMENTS

| | | | |
|---|---|---|---|
| 3,949,206 | 4/1976 | Edwards et al. ............... | 364/724.16 |
| 4,344,149 | 8/1982 | van de Meeberg et al. .... | 364/724.1 |
| 4,615,026 | 9/1986 | Schiff ............................. | 364/724.16 |
| 4,802,111 | 1/1989 | Barkan et al. .................. | 364/724.1 |
| 4,843,581 | 6/1989 | Cupo et al. ..................... | 364/724.01 |

OTHER PUBLICATIONS

*Philips Technical Review* by J. J. Van Der Kam entitled "A Digital Decimating Filter for Analog-to-Digital Conversion of Hi-Fi Audio Signals", vol. 42, No. 6/7, Apr. 1986, pp. 230–238.

*Electronic Components and Applications* by D. Janssen, et al. entitled "PCM Codec with On-Chip Digital Filters", vol. 2, No. 4, Aug. 1980, pp. 242–250.

*Electronics Letters* by E. De Man entitled "Linear Phase Decimation and Interpolation for High-Speed Applications", vol. 24, No. 12, Jun. 9, 1988, pp. 757–759.

*Primary Examiner*—Long T. Nguyen
*Attorney, Agent, or Firm*—Evenson, Wands, Edwards, Lenahan & McKeown

[57] ABSTRACT

Decimation circuitry having a forward shifting data section receiving data samples in order including a plurality of forward decimation registers coupled in-line and providing a forward register output. Each forward decimation register operates as a first-in-first-out (FIFO) register having a decimation depth. A backward shifting data section includes a plurality of backward decimation registers having a decimation depth coupled in-line and providing a backward register output. One of the backward decimation registers which receives data samples in sequence from one of the forward decimation registers can function as both a last-in-first-out (LIFO) and a FIFO register, when a LIFO register, it operates to reverse blocks of data samples wherein the size of each block corresponds to the decimation rate. Each reversed block is then shifted through the backward shifting data section. Each of the other backward decimation registers operates as FIFO register. The decimation circuitry can be used to form a digital filter cascadable into various sizes.

31 Claims, 9 Drawing Sheets

FIG. 9

FOLD AND DECIMATE FILTER ARCHITECTURE

FIELD OF THE INVENTION

The present invention relates to filters and, more particularly, to a digital filter architecture which exploits the symmetry in finite impulse response (FIR) coefficients.

BACKGROUND OF THE INVENTION

Digital filter design encounters various problems with respect to the filter architecture and the operating speed. Filter products have been produced which take advantage of certain characteristics of many classes of digital filters. For example, symmetric filters wherein the filter coefficients on each side of the center of the filter are the same (or differ only in sign), can be used to allow the filter to "fold" the data around thus decreasing the number of multipliers required for each tap of the filter. These filters however require an input for each output and are thus computationally intensive. Other filter products are known which make use of decimation to implement longer filters with only a limited amount of architecture hardware. However, there is still needed a digital filter product which can both fold the data around to take advantage of symmetry characteristics of the filter and perform decimation to reduce the amount of computations, obtain longer filters, and reduce the amount of filter hardware.

SUMMARY OF THE INVENTION

The present invention meets this need by providing a digital filter architecture which allows for decimation of the output data samples and a folding around of the samples to advantageously utilize the symmetry of the digital filter. A filter stage such as a finite impulse response (FIR) filter stage includes a decimation section having a number of decimation registers or memory elements. The decimation registers include a forward shifting section and a backward shifting section. The data samples are folded around from the forward section to the backward section at the center tap. The input to the backward shifting section makes use of a last-in, first-out (LIFO) register or memory element, or a similar structure, for reversing the sequence of each block of data samples in each decimation register as they pas through the backward shifting section. This allows the data samples to properly align with the filter coefficients stored in register files in the FIR stage. In this manner, the filter outputs are decimated and a symmetric filter for an even or odd number of taps is implemented for even or odd symmetry.

The filter stage includes a forward shifting data section receiving data samples in order including a plurality of forward decimation registers coupled in-line and providing a forward register output. Each forward decimation register operates as a FIFO register having a decimation depth. A backward shifting data section includes a plurality of backward decimation registers having a decimation depth and providing a backward register output. One of the backward decimation registers, which receives data samples in sequence from one of the forward decimation registers operates as a LIFO register to reverse sequence blocks of the received data samples in the LIFO register before shifting the reversed sequenced blocks of data samples through the backward shifting data section. Each of the other backward decimation registers operates as a FIFO register.

It is an advantage of the present invention to allow for a number of filter applications using a chip having at least two FIR stages. The only limiting factors include the clock rate, coefficient storage capability, and data storage of the device. The invention allows the building of complex arithmetic filters used to remove intersymbol interference, and distortion due to asymmetry in analog intermediate frequency (IF) filters. Further, both one-dimensional and two-dimensional filtering can be implemented using the present invention. Also, multi-rate filter and high-sample rate filter applications can be produced according to the present invention.

The digital filter architectures of the present invention can include a decimating memory such as described in co-pending application Ser. No. 07/724,206, filed on Jul. 1, 1991 and being commonly assigned to the assignee of the present invention, the specification of which is herein expressly incorporated by reference.

Other objects, advantages and novel features of the present invention will become apparent from the following detailed description of the invention when considered in conjunction with the accompanying drawings.

BRIEF DESCRIPTION OF THE DRAWINGS

FIG. 4b illustrates an example of an output word format with programmable rounding for FIR A and FIR B in FIG. 4a;

DETAILED DESCRIPTION OF THE DRAWINGS

Figure 1:
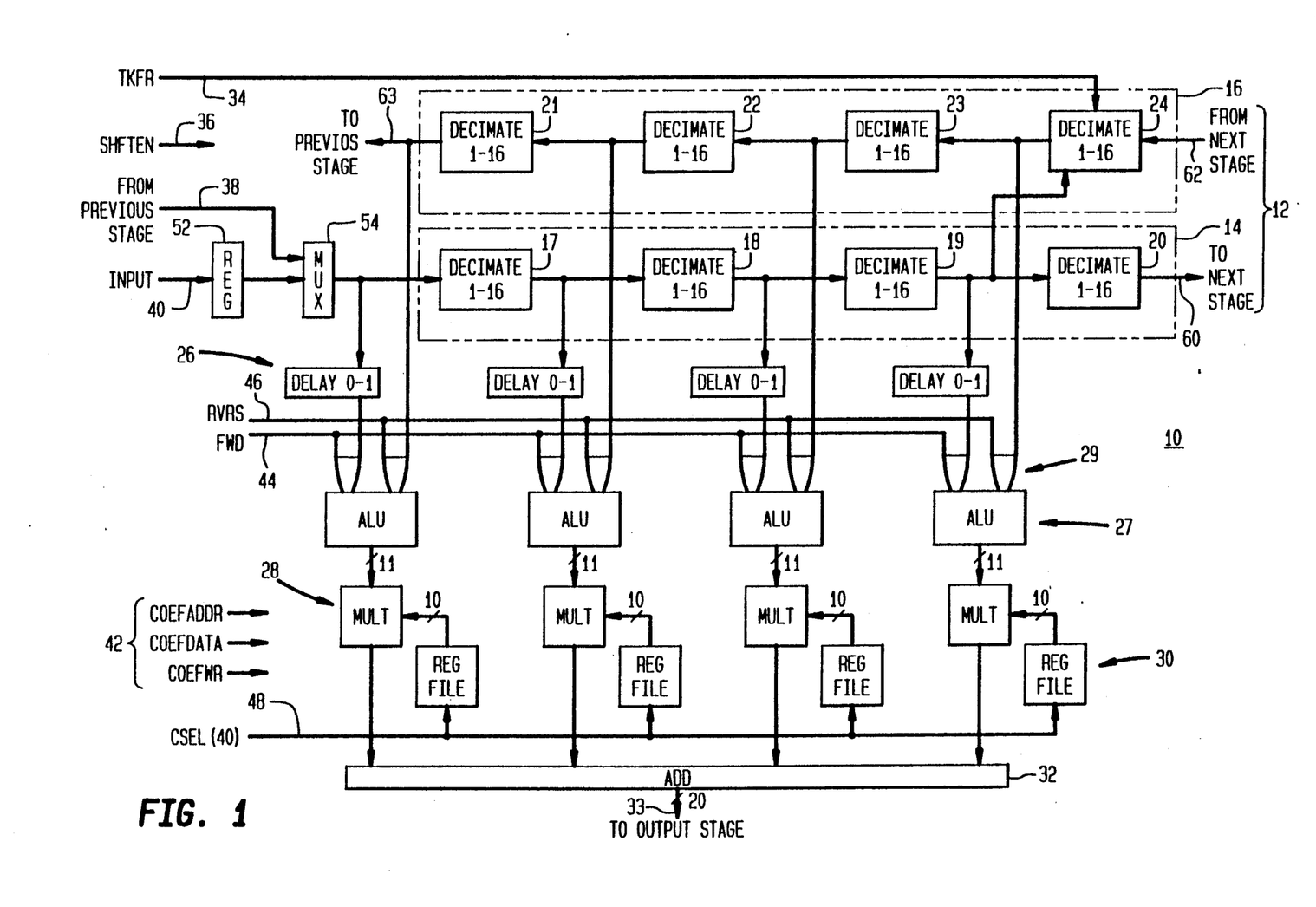
FIG. 1 is a block diagram illustrating an implementation of a filter stage of the present invention.

Referring to FIG. 1, a schematic block diagram 10 of a finite impulse response (FIR) filter stage including fold and decimate circuitry is shown. This FIR stage 10 can be used to form various types of digital filters, examples of which will be described below. Each FIR stage 10 includes a decimation register section 12 having two sets of decimation registers or memory elements 14 and 16. Decimation register set 14 is a forward shifting data section shown to include decimation registers or memory elements 17-20. Decimation register set 16 is a backwards shifting data section including decimation registers or memory elements 21-24. It will be understood that the number of decimation registers as well as other components in the FIR stage 10 are illustrated by way of example and can be expanded or lessened depending upon the application desired.

Each of the registers 17-24 in the decimation section 12 have outputs which are provided to arithmetic logic units (ALUs) 27 through AND gates indicated generally at 29. As shown in FIG. 1, one output each from a forward shifting decimation register and a backward shifting decimation register is provided to each of the ALUs 27 through respective AND gates 29. These AND gates 29 have as their other input a forward (FWD) signal line 44 and a reverse (RVRS) signal line 46 for enabling the gates 29 to pass the output information to the ALUs 27. The ALUs 27 provide their output to a series of multipliers 28; there being one multiplier 28 for each ALU 27. The multipliers 28 further receive an additional input from a register file 30 coupled thereto. The output from the multipliers 28 are provided to an adder 32. The adder 32 then provides the output 33 from the FIR stage 10.

The decimation registers 12, as mentioned above, include a forward shifting data section 14 and a backward shifting data section 16. The input data 40 is supplied through a register 52 and multiplexer 54 before being provided as an input to the first decimation register 17 in the forward shifting data section 14. At the same time, this input data from the multiplexer 54 is provided through a delay element 26 to the ALU 27 when the forward line 44 is enabled.

The input data from the first decimation register 17 in the forward shifting data section 14 is shifted through the other decimation registers 18-20 and is "folded" over to the backward shifting data section 16 at the center tap. This "folding" is conceptionally illustrated via line 50 from decimation register 19 which provides an input to the first backward shifting decimation register 24 as well as to the final decimation register 20 in the forward shifting section. The input data is then shifted backward through decimation registers 23, 22 and 21. At the same time, each of the registers provides an output to the ALUs 27. The backward shifting register section 16 is used to take advantage of the symmetry of linear phase filters and is used to hold additional data for asymmetric filters whenever a trade-off between the processing rate through the filter and the filter length is desired. This multiplexes the data from the forward and backward registers to the multiplier during each input data clock cycle. Each of the decimation registers 17-23 function as first-in, first-out (FIFO) registers to pass the data samples in sequence. However, decimation register 24 is operable to function as both a last-in, first-out (LIFO) register and a FIFO register. Register 24 functions as a LIFO in order to reverse the order within blocks of the input samples in each decimation register 21-24 in the backward shifting section 16 and thereby "fold" the data at the center tap of a symmetric filter. The block size corresponds to the decimation rat of the filter. The register 24 can function as a FIFO when the filter section 10 of FIG. 1 forms an intermediate section of a longer, cascaded filter. The register 24 can also operate as either a FIFO or a LIFO for the asymmetric filter case.

The decimation registers 17-24 can be composed of a shift register memory or, as a random access memory having locations which are sequentially addressed to generate the FIFO and LIFO functions.

The use of the LIFO decimation register 24 in this fold-over architecture allows the backward shifting data section 16 to align the input samples in reverse order in each decimation register 21-23 so as to properly align with the filter coefficients stored in the register files 30. This allows a proper multiplication to occur in multiplier blocks 28 for the FIR filter stage 10.

In a preferred embodiment, the decimation registers 17-24 are illustrated as decimate 1-16 registers. These registers are thus capable of decimating from one to sixteen in accordance with the depth of the register. For example, a decimate by two filter would have the decimation registers 17-24 set to a depth of two and hence LIFO register 24 would reverse sequence each block of two input samples.

In an implementation providing greater detail, the finite impulse response stage 10 of FIG. 1 includes four $11 \times 10$ bit twos complement multipliers 28. As noted above, one input comes from an ALU 27 that combines the output data from the forward and reverse decimation registers in the forward shifting 14 and backward shifting 16 sections, respectively. Again as noted above, the forward data can pass through an additional single delay stage 26 to align the data properly for symmetrical filters. The use of the delay depends upon whether the symmetric filter has an even or odd number of taps, i.e. an odd number requires a delay whereas an even number of taps does not. In the preferred embodiment, the other input to the multiplier 28 is provided from a thirty-two location, ten bit wide register file 30. Each location of each register file 30 has a unique write address and holds a unique filter coefficient. All of the register files 30 receive the exact same read address lines 48, thus a coefficient is read from each of the register files simultaneously. The outputs of the four multipliers 28 in the FIR stage 10 are summed and sent to the output section wherein they are multiplexed, added, and/or accumulated, then programmably rounded (FIG. 4b), as will be shown in FIG. 2a.

Figure 2A:
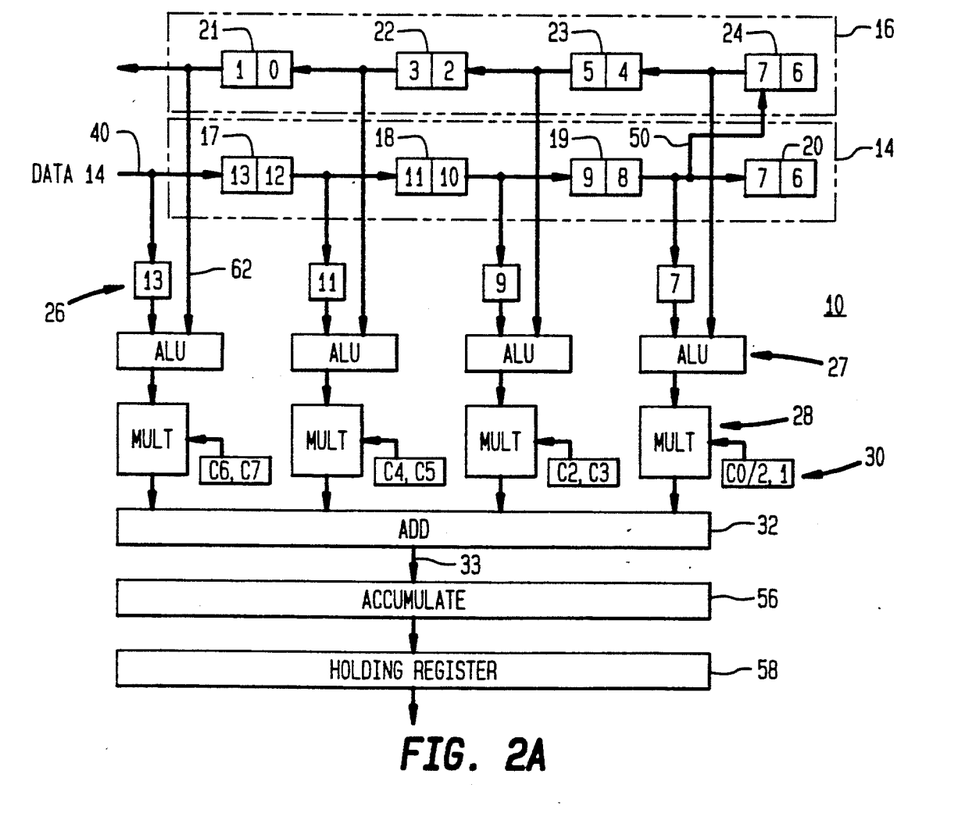
FIGS. 2a and 2b are a functional block diagram and graphical representation of the operation of FIG. 1, respectively.
Figure 2B:
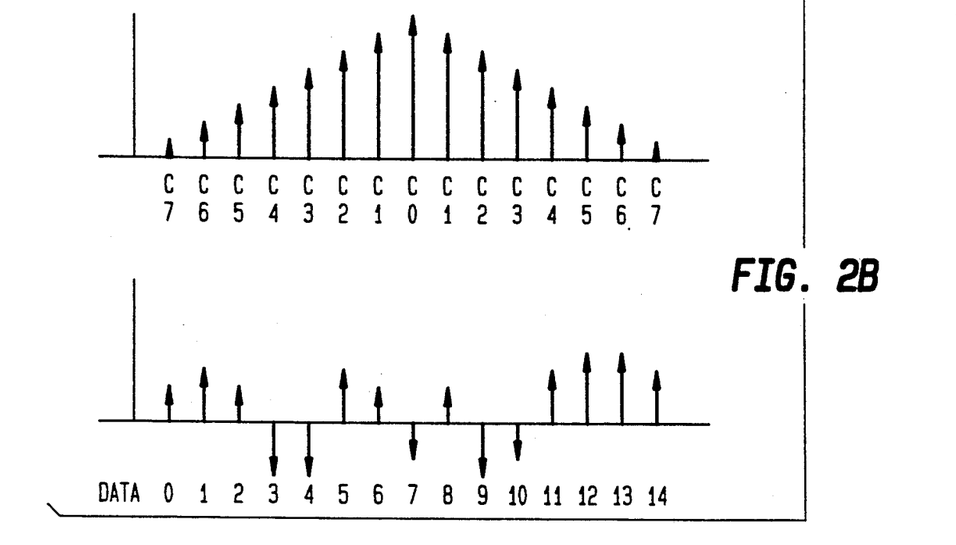

FIGS. 2a and 2b illustrate a one-dimensional symmetric filter's data flow for a 15 tap (even symmetry) decimate-by-two filter using one FIR stage 10. As noted above, the decimation registers or memory elements 17-24 are set to a depth of two and are illustratively shown with the data sample, i.e. 0-14, in the memory elements 17-24. Data is input to the forward shifting register section 14 via line 40. FIG. 2b graphically represents the filter coefficients and data input for the FIR stage 10. For example, coefficient four (C4) must be multiplied with data sample three (D3) and eleven (D11) as seen in FIG. 2b. With reference to FIG. 2a, data from the forward shifting section 14 is delayed in delay stage 26. ALU 27 receives one input from delay register 26 and the other input from backward shifting register section 16. The multiplication block 28 to which the coefficient C4 is supplied as an input receives as a further input the sum of data sample D11 output from delay register 26 and the data sample D3 output from backward shifting decimation register 22 produced by adder 27. In order for these data samples to align properly with the proper filter coefficients, decimation register 24 functions as a LIFO register to reverse sequence data samples within each block corresponding to the decimation rate in each backward shifting memory element 21-24 when the data samples are folded over.

The delay stage 26 is shown containing the output data from the forward shifting decimation registers in order to align the data for an odd number of taps in the filter. In this manner, the coefficients, indicated generally at 30, which are input to each multiplier 28, will receive the proper data as shown in the graph of FIG. 2b. The output from the multipliers 28 are then again provided to the add block 32 which provides its output 33 to an accumulator 56 and holding register 58.

Figure 3A:
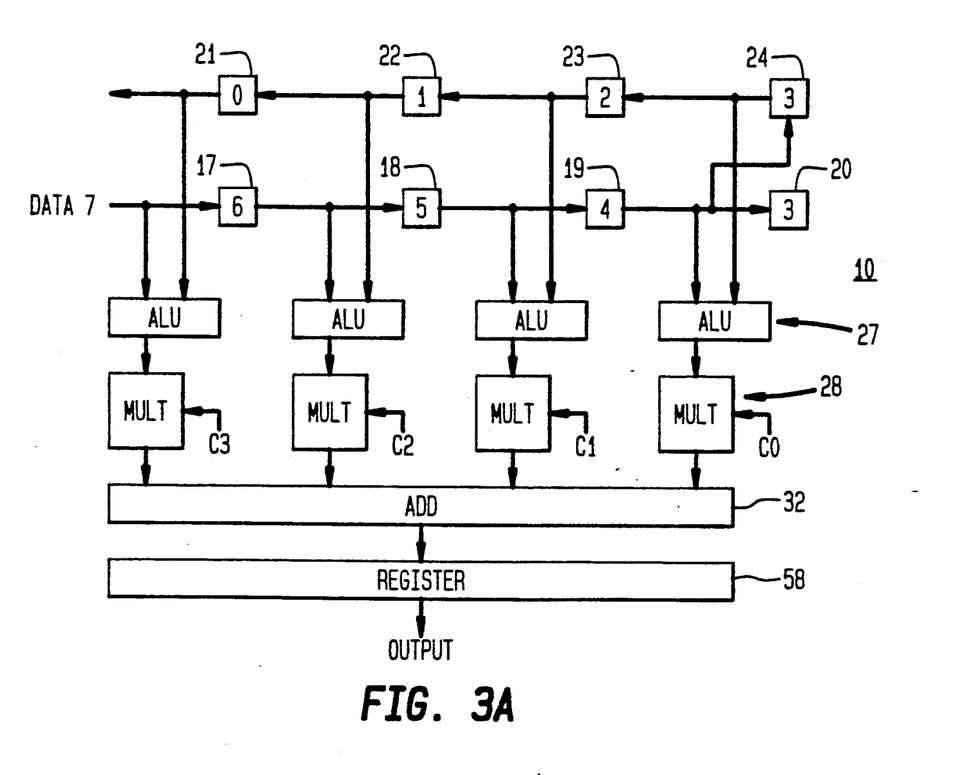
FIGS. 3a and 3b are a functional block diagram and graphical representation, respectively, of the operation for another configuration of FIG. 1.
Figure 3B:
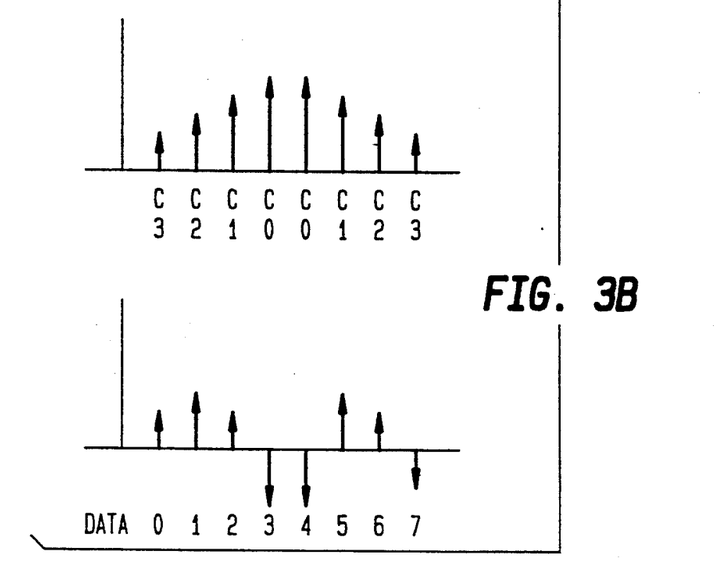

The example of FIG. 2a given above is for an FIR stage having even symmetry and an odd number of taps wherein the two data sample values are added in ALU 27 prior to the multipliers 28 wherein they are multiplied by the filter coefficient values. For a symmetric filter having both even symmetry and an even number of taps, as is shown in FIGS. 3a (no decimation shown) and 3b, the data samples are also added in ALU 27 prior to the multiplier 28. It should be noted, however, that for odd symmetry cases, one data sample is subtracted from the other in the ALUs 27. Similarly, it should be noted that the delay element 26 is not needed when the filter has an even number of taps. FIG. 3a shows the data flow through the memory elements 17–24 for a symmetric eight-tap filter having an even number of coefficients and no decimation as evidenced by the depth of the registers or memory elements 17–24, i.e. registers 17–24 have a depth of one.

Referring back to the even symmetry filter of FIG. 2a, the accumulator 56 provides a summing of two products from each multiplier 28 for each output (decimate-by-two has one output for every two inputs). For symmetry to occur, the two data samples multiplied by each filter coefficient value are either summed or subtracted and then multiplied in accordance with the associative properties of multiplication, i.e. $A*B \pm A*C = A*(B \pm C)$ where A is the filter coefficient value. The values are summed for even symmetry and subtracted for odd symmetry. The data sample sequence for each block of samples is reversed in the last decimation register 24. The center data sample in the filter is the first data sample into the last multiplier 28 after the transfer signal 34 (FIG. 1) is enabled. Because of the odd number of taps, the center sample is repeated, i.e. comes from both the forward and reverse paths so that the center coefficient must be scaled in half or only have one value passed by ALU 27 to multiplier 28. This is seen in FIG. 2a wherein the register file 30 holding the center coefficient C0 is scaled in half to be C0/2.

It is apparent that the single FIR stage 10 shown in FIGS. 1–3 can be cascaded to form a longer filter. In such a case, the input data would be received via the previous stage data input line 38 into the multiplexer 54 as shown in FIG. 1. In the same manner, the decimation register 20 at the end of the forward shifting data section 14 would provide an output 60 to the next FIR stage cascaded in line. Also, the decimation register 24 would receive an input from the next stage cascaded in line as indicated via input 62. Input 62 is provided from output 63 of the next filter stage cascaded in line. When the FIR stages 10 are cascaded to form a longer filter, then the decimation register 24 in any intermediate stage 10 of the filter would function as a FIFO register rather than a LIFO register. Only the last cascaded section, i.e. the middle of the filter, would have decimation register 24 functioning as a LIFO so as to reverse the data sample block sequence in the backward shifting data path 16.

Figure 4A:
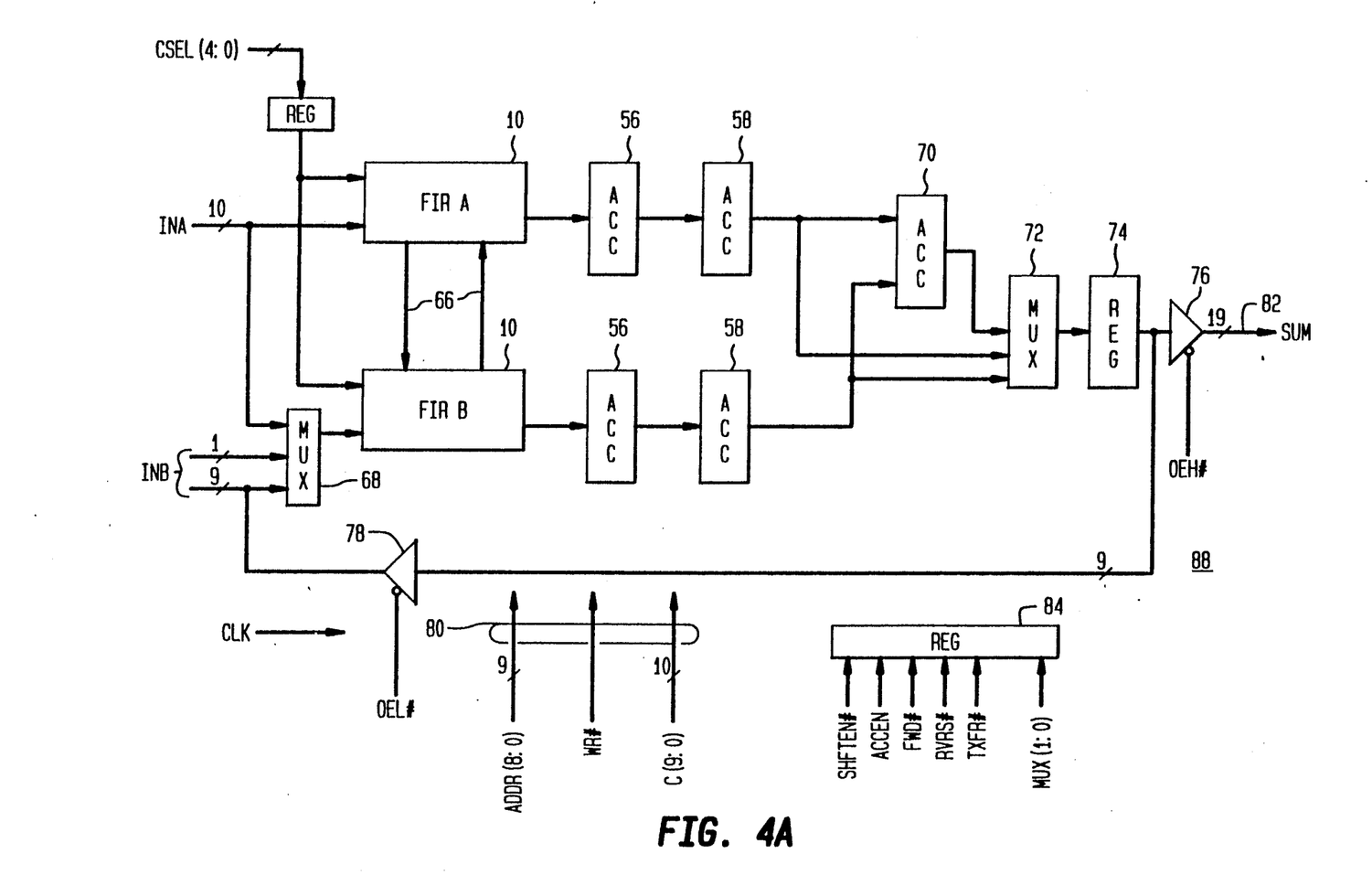
FIG. 4a is a block diagram illustrating a dual-digital filter using filter stages of the present invention.
Figure 5:
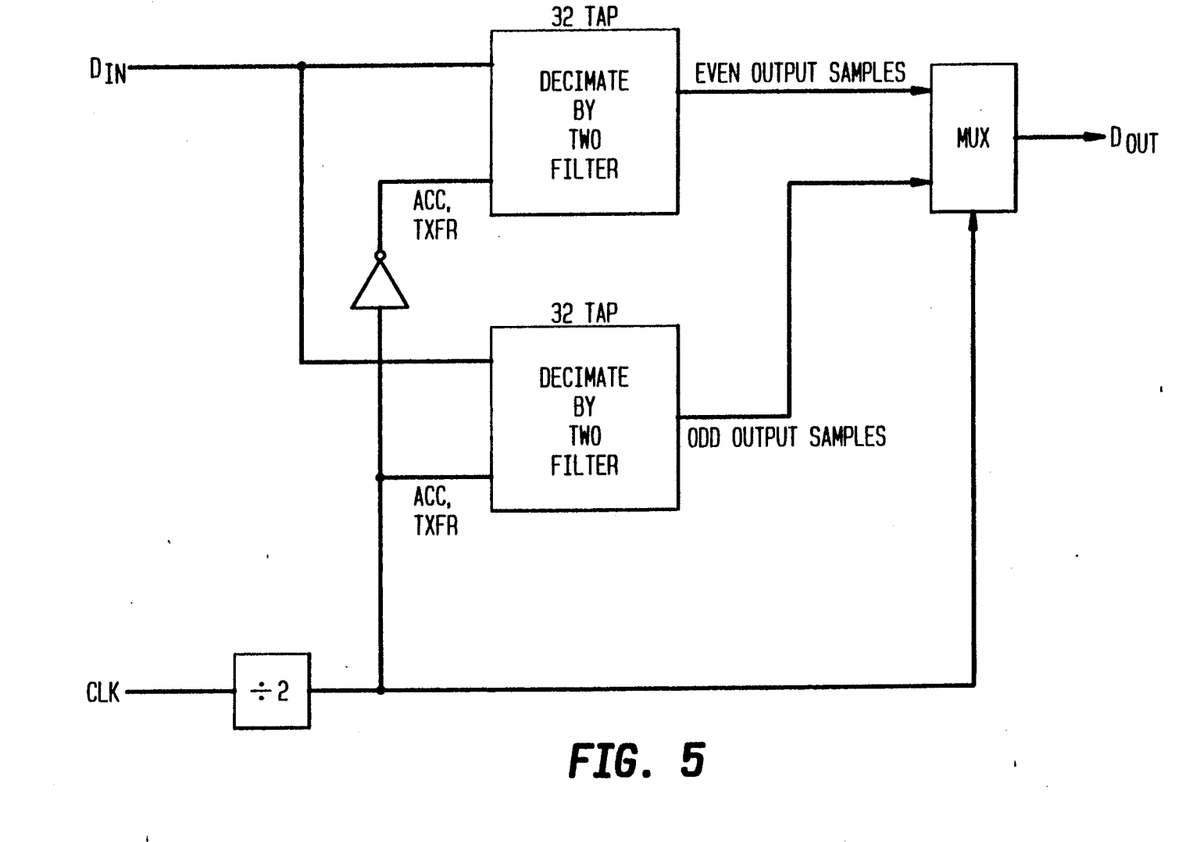
FIG. 5 is a block diagram of a 32-tap polyphase filter without decimation.

The fold and decimate circuitry of each FIR stage 10, examples of which are shown in FIGS. 1 and 2a, can be used to form several different types of filters. FIG. 4a is a block diagram using the FIR stage circuitry 10 of the present invention to provide a dual-digital filter product. Two FIR stages 10, FIR A and FIR B, are shown coupled to their respective inputs INA and INB. The two filter stages 10 can be cascaded together to form a longer filter using coupling lines 66 or multiplexer 68 can be used to implement two filters. As noted above, each FIR stage 10 has its own data input pins. In order to keep the pin count to a minimum, no cascade output is provided. Longer filter lengths may be implemented using polyphase configurations as shown in FIG. 5 for a 32-tap polyphase filter without decimation.

In FIG. 4a, the filter coefficients are loaded via a parallel port having ten data lines (C(9:0)), nine address lines (ADDRESS(8:0)) and a write strobe line (WR#), all of which are indicated generally at 80. Nineteen of the filter output bits are provided at the output port 82 of the dual-digital filter 88 and nine bits are fed back through the INB input port through tri-state output buffer 78. A shifter (not shown) is provided in the output stage to shift the FIR B output by $2^{-10}$. This implementation allows a 10-bit data and a 20-bit coefficient filter. The us of two of such dual filter chips 88 along with an adder gives the operator a $20 \times 20$ finite impulse response filter using a shift and add configuration.

The implementation of FIG. 4a is described in greater detail to include twenty data input pins divided into two sets of ten: INA (9:0) and INB (9:0)/SUM (8:0). Tri-state buffers 78 for the output SUM (8:0) are enabled via signal OEL#. Further, nineteen additional output pins, SUM (27:9), can be tri-stated via buffer 76 which is enabled with the signal OEH#. A single clock (CLK) signal operates the dual-digital filter of FIG. 4a. The clock signals all of the registers except for processor interface registers. A 20-pin write-only processor interface is used having the input pins designated generally at 80.

Additional control lines: Accumulate enable (ACCEN), Transfer (TXFR#), Shift Enable (SHFTEN#), Forward (FWD#), Reverse (RVRS#), and Multiplex (MUX(1:0)) are all registered 84 at the input to the specific part. The ACCEN signal, when inactive, enables clocking data from the accumulator 56 to the holding register 58. This signal when inactive further clears the feedback in the accumulator 56.

Figure 4B:
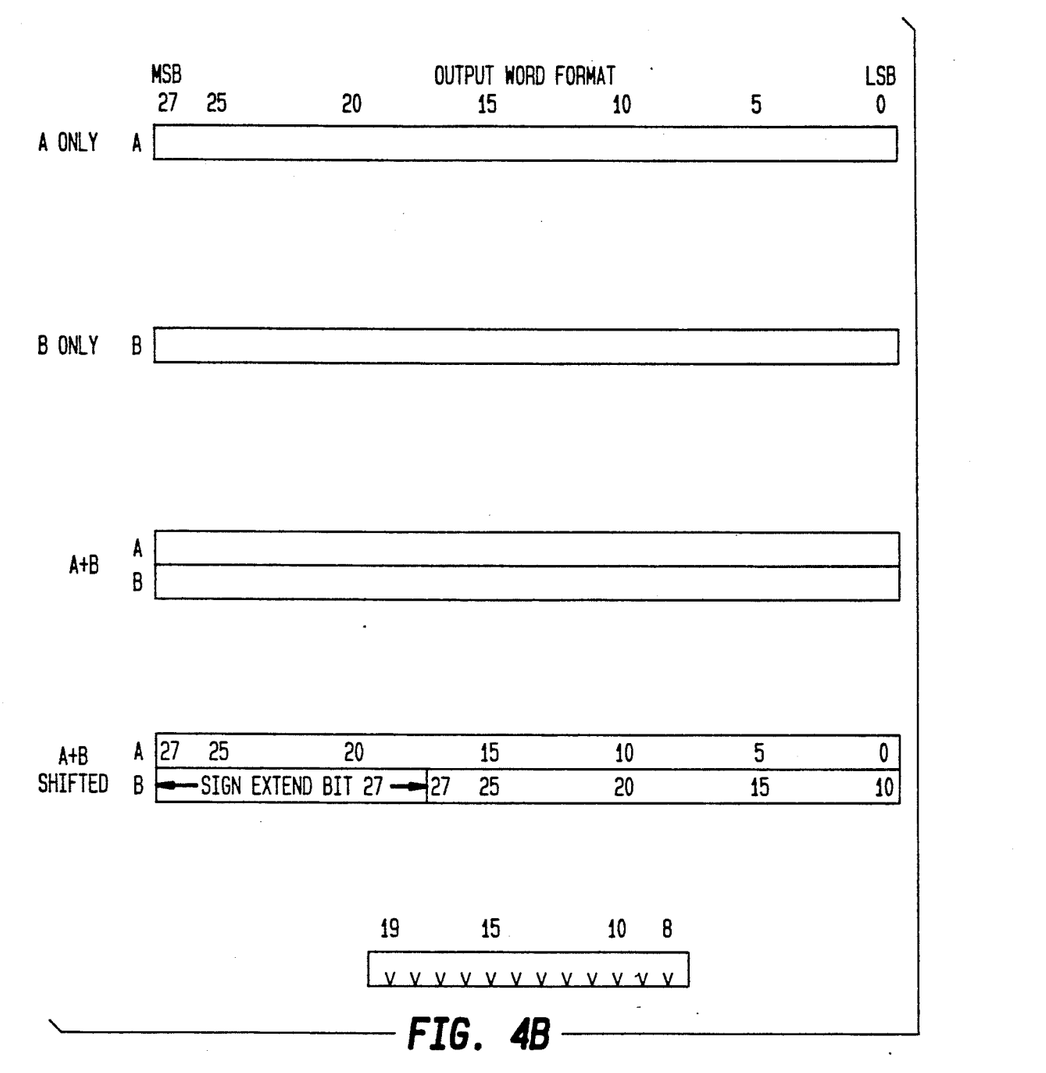

The outputs of the A and B holding registers 58 are provided to adder block 70 which provides an additional input to multiplexer 72. A rounding and shifting operation of the filter data is performed at the combination of the FIR A and FIR B outputs from holding registers 58. This rounding feature is programmable and capable of rounding, for example, in twelve different bit positions. Further, the rounding feature can also be disabled when necessary. FIG. 4b shows an example of an output word format for FIR A and FIR B as well as the combination of the two. The rounding occurs by adding a one in the programmed bit position (round up or round to $+\infty$). Rounding occurs using saturation logic which detects the condition when the result from the filter is 01xxx... (the most positive number possible to represent when the filter is programmed for two's complement operation without overflow occurring). If the saturation logic is enabled, the number 01xxx... is replaced with 00111... Thus, the output of the filter can be represented by one less bit and not be degraded by one bit, as it would otherwise be without the saturation. If the saturation bit is disabled, the result is passed unchanged to the output.

When enabled, the Transfer (TXFR#) signal reverses the read and write order into the decimation register 24 (FIG. 1) in the last stage 10 of the filter to reverse the data order and fold the data for symmetric coefficient filters, thus allowing the decimation register file 24 in the filter to act as a LIFO buffer, i.e. data is written into the buffer in one order and read out of the buffer in a reverse order for every block of data samples corresponding to the decimation rate. While the data is read out of the buffer 24, new data is written into the buffer. When the Transfer signal is enabled and asserted, the address ordering is reversed, i.e. lowest to highest transfer, highest to lowest transfer, lowest to highest, etc. The Forward and Reverse signals enable the inputs to the ALUs 27 from the forward and reverse decimation register sections 14 and 16, respectively (FIG. 1). The shift enable signal enables the clocking of the decimation registers 17-24 and the registers in the forward portion of the pre-adder. The other control lines further operate the dual-digital filter in accordance with the teachings of the present invention.

Figure 6:
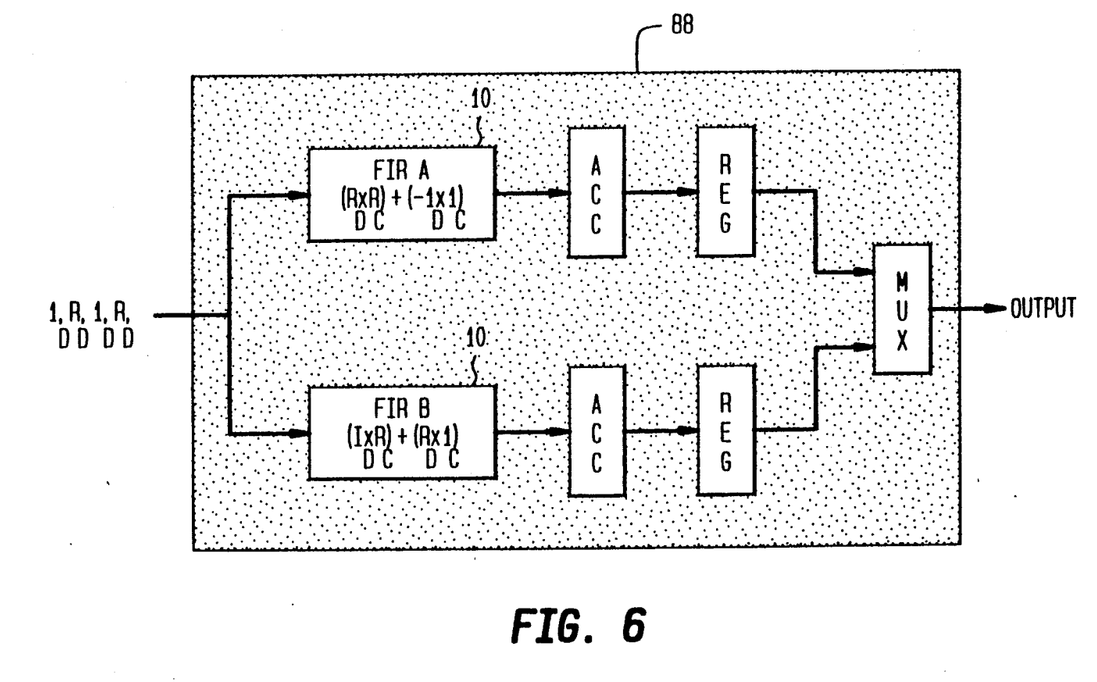
FIG. 6 is a block diagram of a complex arithmetic FIR filter.

Referring to FIG. 6, there is shown a block diagram of an implementation for a 16 Mega samples per second, 8-tap complex arithmetic decimate-by-two filter using the FIR stages 10 of the present invention, clocked at 32 MHz. The complex arithmetic filter is used to remove intersymbol interference, multi-path distortion, and distortion due to asymmetry in analog intermediate frequency (IF) filters. As shown in FIG. 6, complex multiplies are performed with two FIR sections, e.g., the real and imaginary components are interleaved at the input—FIR A multiplier $(R_D \times R_C)+(I_D \times -I_C)$ obtains the real portion and FIR B multiplier $(I_D \times R_C)+(R_D \times I_C)$ obtains the imaginary portion of the output within two clock cycles. The real and imaginary data inputs ($R_D$ and $I_D$) are thus multiplexed at the input to the filter such that an output is produced every four clocks, i.e. every two complex inputs for a decimate-by-two filter. $R_C$ and $I_C$ denote the real and imaginary coefficients. The real and imaginary filter results are multiplexed at their output. The filter clock in this example runs at 32 MHz, the data rate being 16 MHz (complex) and the output is 8 MHz (in the general case, for this application, the filter runs at "N" MHz, the data rate being N/2 and the output N/4).

Figure 7A:
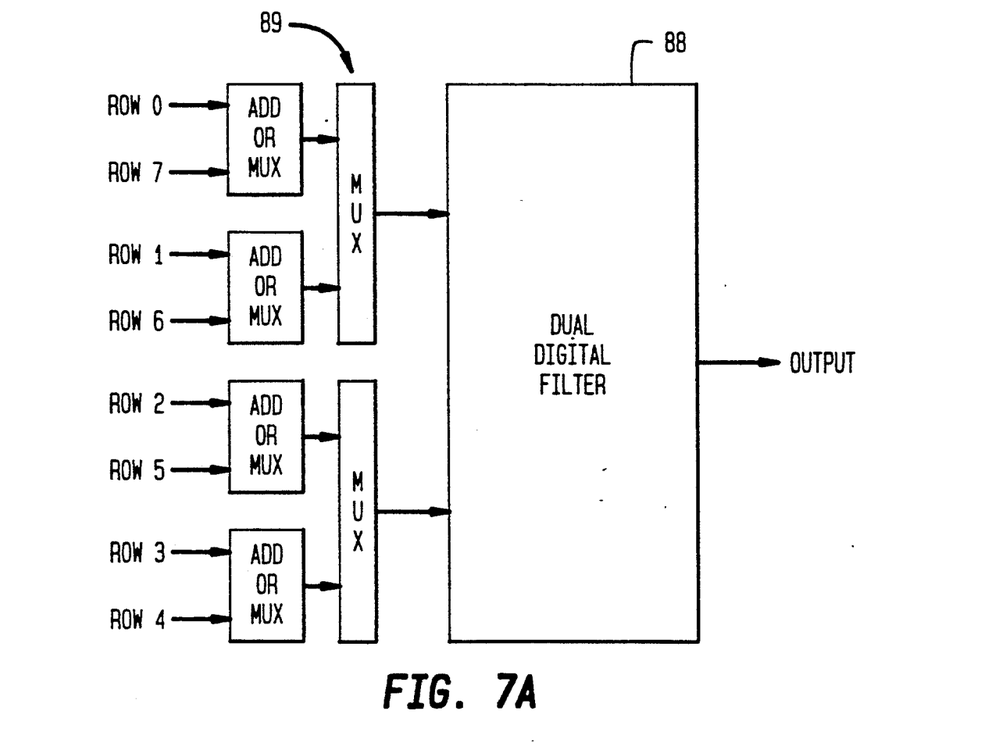
FIGS. 7a and 7b are a block diagram and a graphical representation, respectively, illustrating two-dimensional processing using the present invention.
Figure 7B:
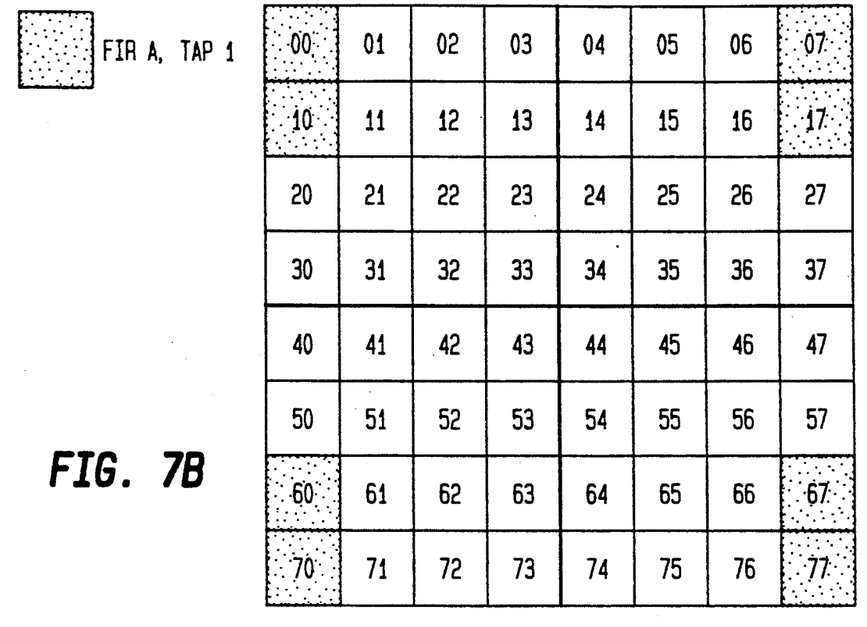

FIG. 7a is a general block diagram showing the implementation of two-dimensional (2-D) filtering using the dual-digital filter 88 described in FIG. 4a. FIG. 7b is an example of an 8 by 8 kernel, i.e. an 8 by 8 array of data points, having both horizontal and vertical symmetry. In FIG. 7a, four rows of the kernel shown in FIG. 7b are multiplexed 89 at the input to the dual-digital filter 88. By using a 32 MHz dual-digital filter 88, two-dimensional asymmetric filters sized up to 16×16 (1 MHz) are possible with a single dual-digital filter 88. Symmetric filters up to 32×16 and at 2 MHz are also possible.

Figure 8:
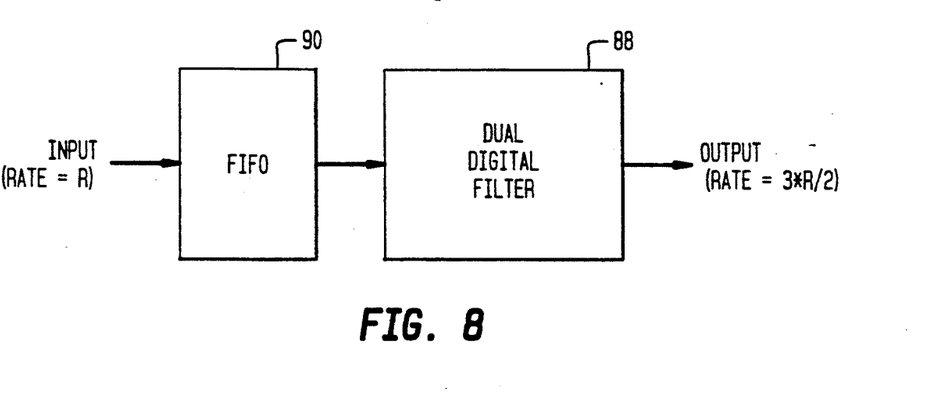
FIG. 8 is a block diagram of a multi-rate filter according to the present invention.

FIG. 8 is block diagram of a multi-rate filter application using the dual-digital filter 88. In this example, the output data rate (R) is 1.5 times the input data rate. For multi-rate filter applications, the dual-digital filter 88 must handle the higher of the input o output data rates. Non-integer rate change filters require a FIFO buffer 90 to smooth either the input or output data rates. In the example shown in FIG. 8, a filter is designed at the least common multiple data rate wherein the FIFO buffer 90 is used to smooth the input data rate. Multi-rate filters have applications which include video scan converters that convert from one video line width to another and sub-band communications processing wherein the frequency band is divided to simplify processing each frequency rang and then recombined for a wide-band output.

Figure 9:
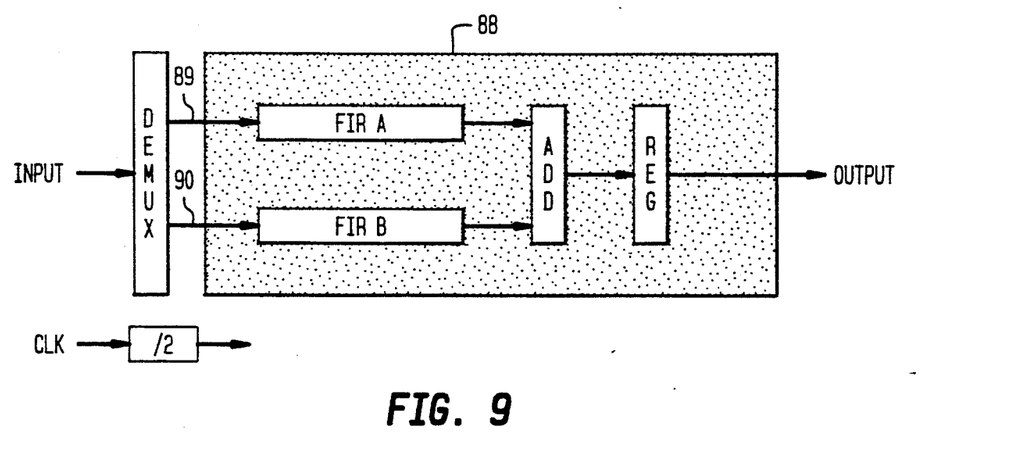
FIG. 9 is a block diagram of a high-speed decimate-by-two filter.

FIG. 9 is a block diagram example of a high-sample rate application of the dual-digital filter 88. In this example, the input data stream (INPUT) is divided into even and odd phases 89 and 90. Even samples are fed to the FIR A and the odd samples are fed to FIR B. This effectively decimates the samples before the filter since each data sample is multiplied by every other coefficient. If no decimation is necessary, multiple filters can be used to generate additional output samples, i.e. one dual-digital filter chip 88 would generate an odd output sample and the other would generate an even output sample, which samples can then be multiplexed to give a full speed output. A single 32 MHz dual-digital filter 88 can implement a 16-tap symmetric decimate-by-two (or more) filter for 64 MHz input data rates.

Referring back to the FIR stage circuitry 10 in FIG. 1, the decimation function 12 is conventionally implemented with a variable length shift register. A preferred embodiment of the invention uses a random access memory (RAM) in place of the shift registers. The RAM memory locations are sequentially addressed to generate the FIFO and/or LIFO functions necessary for the forward shifting and backward shifting register sections 14 and 16, respectively. The offset between the read and write addresses of the RAM memory can provide the delay function necessary for decimating filters. A preferred decimating memory using RAM memory is described in co-pending application Ser. No. 07/724,206, incorporated by reference above.

Although the invention has been described and illustrated in detail, it is to be clearly understood that the same is by way of illustration and example, and is not to be taken by way of limitation. The spirit and scope of the present invention are to be limited only by the terms of the appended claims.

What is claimed:

1. A digital filter, comprising:
   a decimation circuitry section having a decimation factor, including
   a forward shifting data section receiving data samples in order including a plurality of forward decimation registers coupled in-line and providing a forward register output, each forward decimation register operating as a first-in-first-out (FIFO) register having a decimation depth;
   a backward shifting data section, receiving data samples from said forward shifting data section, including a plurality of backward decimation registers coupled in-line having a decimation depth and providing a backward register output, one of said backward decimation registers which receives data samples in sequence from one of said forward decimation registers operating as a last-in-first-out (LIFO) register to reverse sequence blocks of received data samples, said blocks having a size corresponding to the decimation factor, said blocks being shifted through the backward shifting data section, each of the other backward decimation registers operating as FIFO registers;
   a plurality of arithmetic logic units (ALUs) providing outputs, each of said ALUs operating on the forward register output from one of said forward decimation registers and the backward register output from one of said backward decimation registers;

a plurality of filter multipliers, each of said filter multipliers receiving one of said ALU outputs;

a plurality of filter coefficient files, each of said files providing filter coefficients aligning with said ALU outputs to said plurality of filter multipliers, each of said multipliers operating to provide a multiplied filter output;

means for adding said multiplied filter outputs to provide a summed output; and an output filter section receiving said summed output.

2. A digital filter according to claim 1, wherein said LIFO register is located at a beginning of said backward shifting data section to fold the data sample blocks of a length equal to the decimation factor.

3. A digital filter according to claim 2, wherein said output filter section includes:

an accumulator providing an accumulator output.

4. A digital filter according to claim 3, wherein said output filter section further includes:

a holding register receiving said accumulator output.

5. A digital filter according to claim 1, wherein said digital filter is a finite-impulse response filter and said decimation registers allow programmable decimation of at least one.

6. A digital filter according to claim 2, wherein said digital filter is a symmetric digital filter.

7. A digital filter according to claim 6, wherein said plurality of decimation registers in said forward shifting data section and said backward shifting data section are shift registers.

8. A digital filter according to claim 7, further comprising at least one additional decimation circuitry section cascaded in-line to form an N-length digital filter wherein N equals the number of decimation circuitry sections.

9. A digital filter according to claim 8, wherein said one backward decimation register in each intermediate filter decimation circuitry section operates as a FIFO register except for said backward decimation register receiving input data samples from said forward decimation register section.

10. A digital filter according to claim 2, wherein said digital filter is an asymmetric filter.

11. A digital filter according to claim 10, wherein said plurality of decimation registers in said forward shifting data section and said backward shifting data section are shift registers.

12. A digital filter according to claim 11, further comprising at least one additional decimation circuitry section cascaded in-line to form an N-length digital filter wherein N equals the number of decimation circuitry sections.

13. A digital filter according to claim 12, wherein said one backward decimation register in each intermediate filter decimation circuitry section operates as a FIFO register except for said backward decimation register receiving input data samples from said forward decimation register section.

14. A digital filter according to claim 1, further comprising a plurality of delay registers each of said delay registers coupling with an input to said forward decimation registers and providing an output to said ALUs.

15. A filter section having a filter section output, comprising:

two sets of decimation registers, a first set being a forward shifting section and a second set being a backward shifting section, said forward shifting section receiving data samples in order and shifting the data samples through the first set of decimation registers wherein a first of said decimation registers in said second set of decimation registers is a reversing register for reversing blocks of data samples received from said forward shifting section and passing the reversed blocks through said backward shifting section;

wherein each decimation register in said two sets provides a decimation register output, a set of arithmetic logic units (ALUs) providing ALU outputs, each of said ALUs operating on the decimation register output from one decimation register in each of the forward and backward shifting sections;

a set of multipliers, each multiplier multiplying an ALU output from one of said ALUs with a filter coefficient that properly aligns with said decimation register outputs provided to said ALUs to provide a multiplied filter output;

an adder receiving the multiplied filter output from each multiplier and providing the filter section output.

16. A filter section according to claim 15, wherein said reversing register is a last-in-first-out (LIFO) register and the remaining decimation registers are first-in-first-out (FIFO) registers.

17. A digital filter, comprising:

at least first and second filter stages, each filter stage including a decimation circuit having:

a) a forward shifting data section receiving data samples in order, the forward shifting data section including a plurality of forward decimation registers coupled in-line and providing a forward register output, each forward decimation register operating as a first-in-first-out (FIFO) register having a decimation depth;

b) a backward shifting data section including a plurality of backward decimation registers coupled in-line having a decimation depth and providing a backward register output, one of said backward decimation registers which receives data samples in sequence from one of said forward decimation registers operating as a last-in-first-out (LIFO) register to reverse sequence data samples within blocks of data samples, said blocks having a size corresponding to the decimation factor, said blocks being shifted through the backward shifting data section, each of the other backward decimation registers operating as FIFO registers;

a plurality of arithmetic logic units (ALUs) providing ALU outputs, each of said ALUs operating on the forward register output from one of said forward decimation registers and the backward register output from one of said backward decimation registers;

a plurality of filter multipliers, each of said filter multipliers receiving one of said ALU outputs;

a plurality of filter coefficient files providing filter coefficients aligning with said ALU outputs to said plurality of filter multipliers, each of said multipliers operating to provide a multiplied filter output;

means for adding said multiplied filter outputs to provide a filter output;

means for cascading in-line said first and second filter stages to form a longer digital filter;

means for multiplexing said first and second filter stages to form a longer filter; and means for operating said first and second filter stages in parallel with one another to provide separate digital filters.

18. A digital filter according to claim 17, wherein said means for cascading includes:
    a first coupling between an output end of the forward decimation register in the first filter stage and an input end of the forward decimation register in the second filter stage; and
    a second coupling between an output end of the backward decimation register in the second filter stage and an input end of the backward decimation register in the first filter stage; and means for operating said one backward decimation register in each intermediate filter stage as a FIFO register rather than a LIFO register.

19. A digital filter according to claim 18, wherein an N-length digital filter is obtained by cascading in-line N filter stages.

20. A digital filter according to claim 17, wherein said digital filter is a finite-impulse response filter and said decimation registers allow programmable decimation of at least one.

21. A digital filter, comprising:
    first and second filter stages providing filter outputs;
    first and second accumulators receiving said first and second filter outputs, respectively, and providing first and second accumulator outputs;
    first and second registers receiving the first and second accumulator outputs, respectively, and providing first and second register outputs;
    an adder receiving said first and second register outputs and providing an adder output;
    a multiplexer receiving said first and second register outputs and said adder output and providing a multiplexed output.

22. A digital filter according to claim 21, further comprising:
    an output register receiving said multiplexed output and providing a filter output;
    a feedback path coupling said filter output to an input of one of said first and second filter stages;
    a second multiplexer coupled to said feedback path and inputs to said digital filter and providing a second multiplexed output to said input of said one filter stage.

23. A digital filter according to claim 21, further comprising:
    means for programmably rounding the outputs of said first and second filter stages; and
    means for programmably shifting the outputs of said first and second filter stages.

24. A digital filter according to claim 23, wherein said programmable rounding and shifting means uses saturation logic and is performed by adding a bit value of one in a programmed bit position.

25. Decimating circuitry for use in a digital filter, comprising:
    a forward shifting data section receiving data samples in order including a plurality of forward decimation registers coupled in-line and providing a forward register output, each forward decimation register operating as a first-in-first-out (FIFO) register having a decimation depth;
    a backward shifting data section, receiving data samples from said forward shifting data section, including a plurality of backward decimation registers coupled in-line and providing a backward register output, one of said backward decimation registers which receives data samples in sequence from one of said forward decimation registers operating as a last-in-first-out (LIFO) register to reverse sequence blocks of received data samples, wherein said blocks have a size corresponding to the decimation depth, and shifting said reversed sequence blocks through the backward shifting data section, each of the other backward decimation registers operating a FIFO registers;
    wherein said forward register output from said forward decimation registers and said backward register output from said backward decimation register provides decimated outputs.

26. Decimating circuitry according to claim 25, wherein said LIFO register is located at the beginning of said backward shifting data section to fold the data samples at a block size equal to the decimation depth.

27. Decimating circuitry according to claim 26, wherein said digital filter is a symmetric digital filter.

28. Decimating circuitry according to claim 27, wherein said decimation depth is in a range of at least one to sixteen.

29. Decimating circuitry according to claim 25, wherein said plurality of decimation registers in said forward shifting data section and said backward shifting data section are shift registers.

30. A digital filter according to claim 25, wherein said digital filter is a finite-impulse response filter and said decimation registers allow programmable decimation of at least one.

31. A method of operating decimation circuitry for a digital filter, the method comprising the steps of:
    receiving data samples in a forward shifting data section having a plurality of forward decimation registers coupled in-line;
    operating said forward decimation registers as first-in-first-out (FIFO) registers of a certain decimation depth;
    providing an output from one of said forward decimation registers as an input to a first decimation register in a reverse shifting data section having a plurality of reverse decimation registers;
    operating said first decimation register in the reverse shifting data section as a last-in-first-out (LIFO) register and the other reverse decimation registers as FIFO registers;
    reversing the order of data samples within blocks of data samples received in the first decimation register, said blocks having a size corresponding to the decimation depth;
    passing in-line a reversed output of blocks from the first decimation register to said reverse FIFO decimation registers;
    providing a decimation output from each of the plurality of forward decimation registers and reverse decimation registers; and
    operating on said decimation outputs to provide a filter output.

* * * * *